United States Patent
Paul et al.

(10) Patent No.: US 10,527,407 B2
(45) Date of Patent: *Jan. 7, 2020

(54) IN-SITU METROLOGY METHOD FOR THICKNESS MEASUREMENT DURING PECVD PROCESSES

(71) Applicant: Applied Materials, Inc., Santa Clara, CA (US)

(72) Inventors: Khokan C. Paul, Cupertino, CA (US); Edward Budiarto, Fremont, CA (US); Todd Egan, Fremont, CA (US); Mehdi Vaez-Iravani, Los Gatos, CA (US); Jeongmin Lee, San Ramon, CA (US); Dale R. Du Bois, Los Gatos, CA (US); Terrance Y. Lee, Oakland, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/356,317

(22) Filed: Mar. 18, 2019

(65) Prior Publication Data

US 2019/0212128 A1 Jul. 11, 2019

Related U.S. Application Data

(63) Continuation of application No. 15/184,276, filed on Jun. 16, 2016, now Pat. No. 10,281,261.

(Continued)

(51) Int. Cl.
*G01B 11/06* (2006.01)
*H01L 21/66* (2006.01)
(Continued)

(52) U.S. Cl.
CPC ........ *G01B 11/0616* (2013.01); *C23C 16/509* (2013.01); *C23C 16/52* (2013.01);
(Continued)

(58) Field of Classification Search
CPC .................................................. G01B 11/0616
(Continued)

(56) References Cited

U.S. PATENT DOCUMENTS 4,206,401 A 6/1980 Meyer
4,347,296 A 8/1982 Ishihara et al.
(Continued)

FOREIGN PATENT DOCUMENTS

JP 2009-534854 A 9/2009
JP 2015-078985 A 4/2015

OTHER PUBLICATIONS

Taiwanese Office Action (with attached English translation) for Application No. 105118873; dated May 16, 2019; 10 total pages.
(Continued)

*Primary Examiner* — Tarifur R Chowdhury
*Assistant Examiner* — Omar H Nixon
(74) *Attorney, Agent, or Firm* — Patterson + Sheridan LLP

(57) ABSTRACT

Embodiments of the present disclosure relate to apparatus and methods for forming films having uniformity of thickness on substrates. Embodiments of the present disclosure may be used to measure thickness or other properties of films being deposited on a substrate without knowing beforehand the surface properties of the substrate. Embodiments of the present disclosure may be used to measure thickness or other properties of a plurality of layers being formed. For example, embodiments of the present disclosure may be used in measuring thickness of vertical memory stacks.

20 Claims, 9 Drawing Sheets

Related U.S. Application Data

(60) Provisional application No. 62/222,308, filed on Sep. 23, 2015, provisional application No. 62/181,689, filed on Jun. 18, 2015.

(51) Int. Cl.
*G01B 7/06* (2006.01)
*C23C 16/52* (2006.01)
*C23C 16/509* (2006.01)
*H01J 37/32* (2006.01)
*H01L 21/67* (2006.01)

(52) U.S. Cl.
CPC ........ *G01B 7/085* (2013.01); *H01J 37/32935* (2013.01); *H01L 22/12* (2013.01); *H01L 22/30* (2013.01); *H01J 37/32082* (2013.01); *H01L 21/67253* (2013.01)

(58) Field of Classification Search
USPC .......................................... 356/72
See application file for complete search history.

(56) References Cited

U.S. PATENT DOCUMENTS

| | | | | |
|---|---|---|---|---|
| 5,508,368 | A | * | 4/1996 | Knapp ................ C23C 16/0245 347/203 |
| 5,804,740 | A | | 9/1998 | Kalinoski et al. |
| 5,888,593 | A | * | 3/1999 | Petrmichl ........... C23C 16/0245 204/192.35 |
| 6,160,621 | A | | 12/2000 | Perry et al. |
| 2002/0054290 | A1 | | 5/2002 | Vurens et al. |
| 2003/0067298 | A1 | | 4/2003 | Nagano et al. |
| 2003/0144594 | A1 | | 7/2003 | Gellman |
| 2004/0237888 | A1 | | 12/2004 | Codella et al. |
| 2005/0040146 | A1 | | 2/2005 | Takami |
| 2007/0100580 | A1 | * | 5/2007 | Marcus .............. G01B 11/0683 702/170 |
| 2007/0273948 | A1 | | 11/2007 | Roes et al. |
| 2007/0295272 | A1 | | 12/2007 | Padhi et al. |
| 2011/0013175 | A1 | | 1/2011 | Davis et al. |
| 2013/0120750 | A1 | | 5/2013 | Zheng et al. |
| 2013/0182331 | A1 | | 7/2013 | Hebrink |
| 2014/0118751 | A1 | | 5/2014 | Rajagopalan et al. |
| 2014/0212534 | A1 | * | 7/2014 | Fletcher ................ G03F 7/0002 425/385 |
| 2014/0225606 | A1 | * | 8/2014 | Endo ...................... G01N 27/82 324/260 |
| 2016/0202826 | A1 | | 7/2016 | Han et al. |
| 2016/0362782 | A1 | | 12/2016 | Cheng et al. |

OTHER PUBLICATIONS

PCT Notification of Transmittal of the International Search Report and the Written Opinion of the International Searching Authority for International Application No. PCT/US2016/033053; dated Aug. 17, 2016; 9 total pages.

* cited by examiner

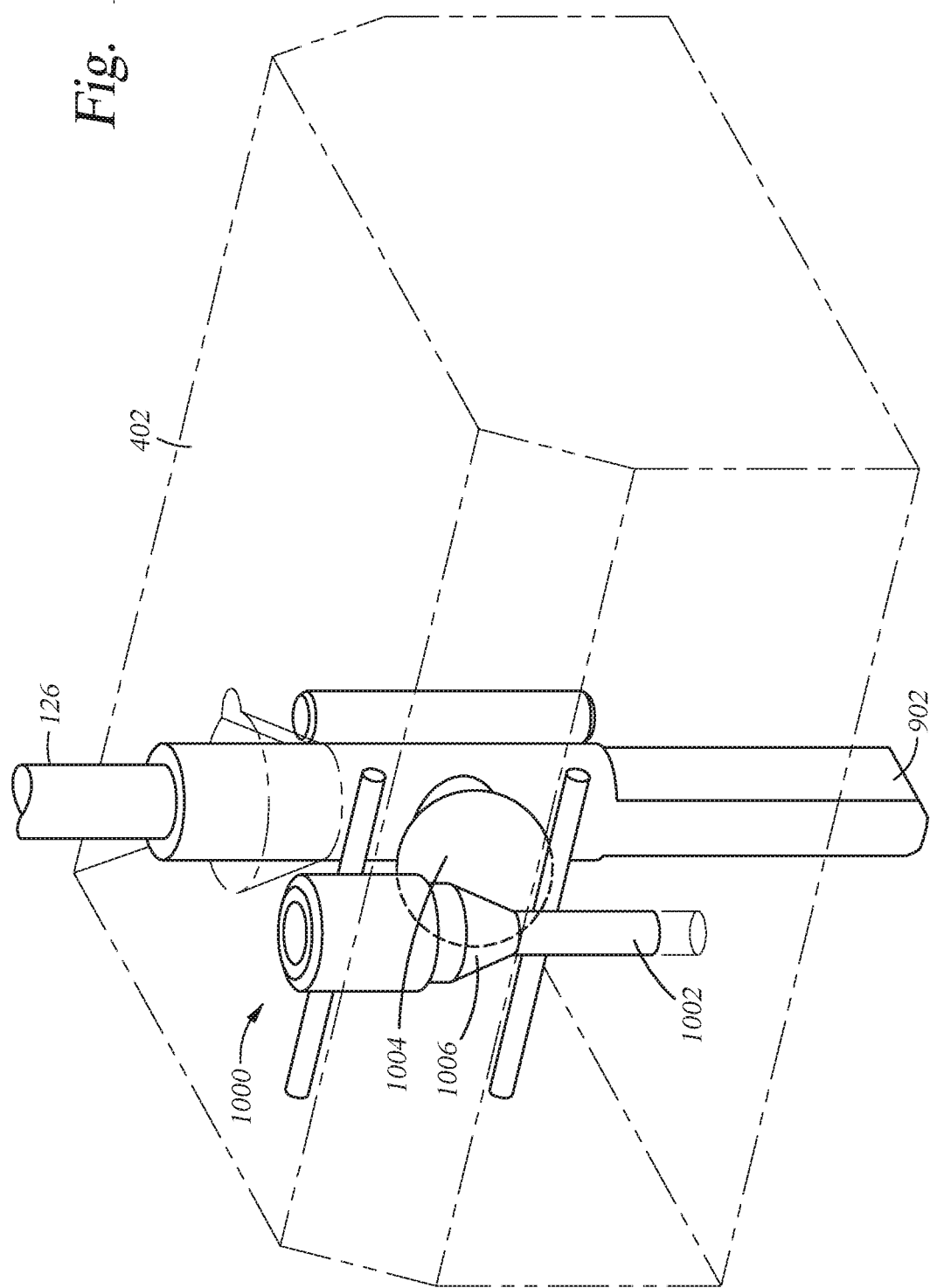

US 10,527,407 B2

IN-SITU METROLOGY METHOD FOR THICKNESS MEASUREMENT DURING PECVD PROCESSES

CLAIM OF PRIORITY UNDER 35 U.S.C. 119

This application is a continuation application of co-pending U.S. patent application Ser. No. 15/184,276, filed on Jun. 16, 2016, which claims benefit of U.S. Provisional Patent Application Ser. No. 62/181,689, filed on Jun. 18, 2015, and U.S. Provisional Patent Application Ser. No. 62/222,308, filed on Sep. 23, 2015, which herein are incorporated by reference.

BACKGROUND

Field

Embodiments of the present disclosure relate to apparatus and methods for measuring properties of films formed on substrate locations having unknown surface properties.

Description of the Related Art

The semiconductor industry has progressed according to Moore's Law for the last fifty years. Moore's Law roughly holds that the number of transistors on an integrated circuit doubles about every two years. Inherent in this law is that the progression of transistor density is two-dimensional, and that at some point physics imposes a limit on how small devices can be.

Recently, manufacturers have developed processes that extend device structures into the third dimension to increase processing capability. Such devices generally feature large numbers of films deposited sequentially on a substrate. In some cases, over 100 films may be formed. When measuring film thickness or other properties in conventional reflectometry, properties of the substrate underneath the film being measured are needed for calculating the properties of the film being measured. Thus, conventional reflectometry only functions properly when the substrate underneath is fully known. For example, when the substrate underneath is a bare silicon wafer, or a silicon wafer with a known stack of blanket films.

However, in semiconductor processing, processing chambers are usually used for depositing films on various substrates. Furthermore, films are usually deposited on substrates with a patterned surface. Even if the pattern is known, the point being measured may not fall in the same region of the pattern for each substrate being measured.

Therefore, there is a need for apparatus and methods for measuring properties of films formed on substrate locations having unknown surface properties.

SUMMARY

Embodiments of the present disclosure relate to apparatus and methods for forming films having uniformity of thickness on substrates. In one embodiment, an apparatus includes a substrate learning system. The substrate learning system includes a hollow cylindrical tube, a film located at one end of the hollow cylindrical tube, and one or more capacitance sensors surrounding the hollow cylindrical tube.

In another embodiment, a method includes placing a substrate into a processing chamber, placing a film over the substrate, the film is a first distance away from the substrate, directing a beam through the film onto the substrate, and obtaining phase variation information from the substrate.

In another embodiment, a method for determining an orientation of a substrate includes directing a light to a surface of the substrate, searching for substrate amplitudes at measurement points by rotating the substrate, and identifying the measurement points having highest reflectivity and consistent reflectivity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 10 illustrates a fiber locking system inside the collimator according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure relate to apparatus and methods for forming films having uniformity of thickness on substrates. Embodiments of the present disclosure may be used to measure thickness or other properties of films being deposited on a substrate without knowing beforehand the surface properties of the substrate. Embodiments of the present disclosure may be used to measure thickness or other properties of a plurality of layers being formed. For example, embodiments of the present disclosure may be used in measuring thickness of vertical memory stacks.

Hardware

Figure 1:
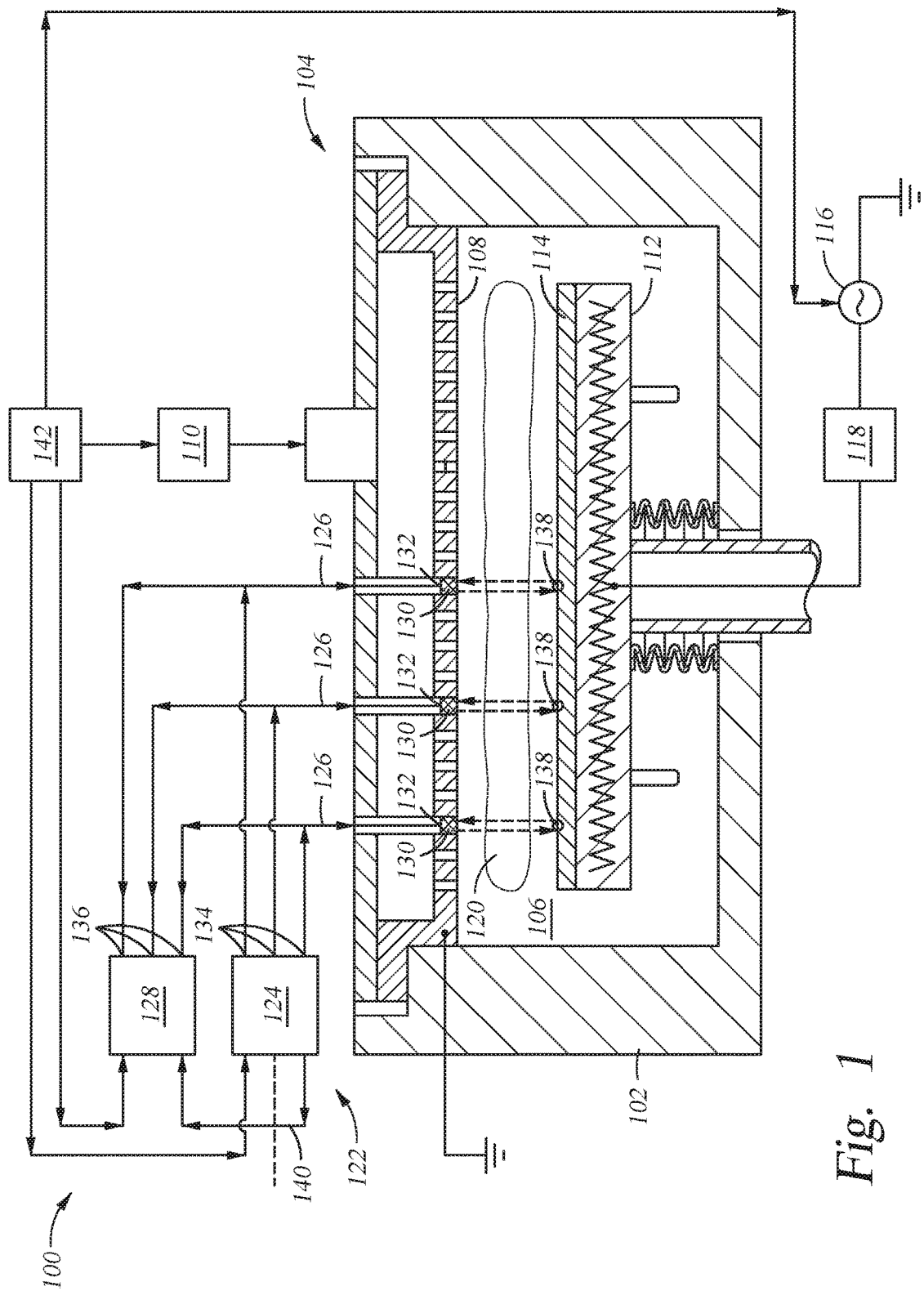
FIG. 1 is a schematic sectional view of a plasma processing chamber according to embodiments described herein.

FIG. 1 is a schematic sectional view of a plasma processing chamber 100 according to one embodiment of the present disclosure. The plasma processing chamber 100 is capable of performing in-situ film property measurement without using information of a base layer on substrates being processed. For example, the plasma processing chamber 100 is capable of measuring thickness of films while forming film stacks for flash memory devices.

The plasma processing chamber 100 may include a chamber body 102 and a lid assembly 104 disposed over the chamber body 102. The chamber body 102 and the lid assembly 104 define a processing volume 106. The lid assembly 104 may include a shower head 108. A gas source 110 may be connected to the lid assembly 104 so that one or more processing gases from the gas source 110 may be delivered to the processing volume 106 through the shower head 108. A substrate support 112 may be disposed in the processing volume 106 for supporting a substrate 114 during processing. The substrate support 112 may be rotated to orient the substrate 114 to a predetermined orientation. The substrate support 112 may be capable of chucking the substrate electrostatically or using vacuum compatible chucking mechanism in order to hold the substrate 114 flat on the substrate support 112. In one embodiment, a radio frequency (RF) power source 116 may be coupled to the substrate support 112 through a matching network 118. The RF power source 116 may apply a RF power between the substrate support 112 and the shower head 108 to generate plasma 120 for processing. In one embodiment, the plasma 120 may be used to deposition films by a chemical vapor deposition (CVD) process.

The plasma processing chamber 100 also includes an in-situ metrology assembly 122. The in-situ metrology assembly 122 may include a light source 124, one or more fiber-optic bundles 126 and a spectrograph 128. The light source 124 and the spectrograph 128 may be secured to the lid assembly 104 by a mounting bracket 202 (shown in FIG. 2) in order to improve mechanical stability of the spectrograph 128 and the light source 124, which in turn improves signal stability. Each fiber-optic bundle 126 may include one or more fiber-optic cables. Each fiber-optic cable may have an inside diameter of about 200 microns, which increases signal intensity and improves alignment sensitivity when compared to fiber-optic cable having a smaller inside diameter. With 200 micron fiber-optic cables, chromatic signal drift is insignificant.

In one embodiment, each fiber-optic bundle 126 includes two fiber-optic cables each having an inside diameter of about 200 microns, one for source signal (from light source 124 to the substrate 114) and one for receiving signal (reflected from the substrate 114), which enables single point for maximum intensity and ensures insensitivity of light injected into the fiber-optic cable regardless of the locking orientation with the light source 124. Each of the one or more fiber-optic bundles 126 has a first end 132 disposed outside of a corresponding observing window 130 in the shower head 108. Each fiber-optic bundle 126 has a second end 134 optically connected to the light source 124, and a third end 136 optically coupled to the spectrograph 128.

The in-situ metrology assembly 122 may also include a fiber-optic cable mount 204 (shown in FIG. 2) that may be placed between the first end 132 and the second end 134, and between the first end 132 and the third end 136. Each fiber-optic bundle 126 is arranged to transmit light from the light source 124 towards the substrate 114 through the observing window 130 so that the light from the light source 124 travels towards a measuring point 138 on the substrate 114 at normal incidence. The fiber-optic bundle 126 then captures reflection of the light from the substrate 114 at normal incidence and then transmits that reflection towards the spectrograph 128. The fiber-optic bundle 126 may collimate the light from the light source 124 to illuminate about 2 mm in diameter at the measuring point 138. A collimator 402 (shown in FIG. 4) may be disposed between the shower head 108 and the lid assembly 104 for each fiber-optic bundle 126. Components, such as the mounting bracket, the fiber-optic cable mount, the attenuator, and one or more plates disposed between the shower head 108 and the lid assembly 104, are omitted in FIG. 1 for better illustration.

The light source 124 may be a flash light source capable of dispersing pulsed light at short durations. The light source 124 may be a white light source. In one embodiment, the light source 124 may be a Xenon flash-lamp. The light source 124 may include a diffuser so the light generated is distributed homogeneously through multiple fiber-optic bundles, such as the fiber-optic bundles 126 and a reference fiber-optic bundle 140. The spectrograph 128 may include a charged-coupled device (CCD) array light detector. In one embodiment, the spectrograph 128 may measure unpolarized light with a wavelength range between about 200 nm and about 2500 nm, such as between about 200 nm and about 800 nm. In some embodiments, the light source 124 may produce ultraviolet (UV) light. In some embodiments, light source producing light having more deep ultraviolet (DUV) content may be used. Examples of the light source for producing light having more DUV content are plasma driven light sources or lasers. In some embodiment, light having wavelength in infrared range (IR) may be used.

The observing windows 130 may be sapphire windows disposed in openings formed through the shower head 108. The sapphire windows of the observing windows 130 may be UV grade, which can prevent signal drift since the UV grade sapphire is insensitive to thermal changes. The observing windows 130 may be made of other materials such as $MgF_2$ or $CaF_2$ that are highly transmissive to UV light. The one or more observing windows 130 may be positioned at various locations for corresponding to various radial locations of the substrate 114. When IR light is used, the observing window 130 may have high IR transmission and thermal stability.

In one embodiment, the reference fiber-optic bundle 140 may be connected between the light source 124 and the spectrograph 128 to provide a reference channel to compensate any fluctuations/drifts overtime of the light source 124. The reference fiber-optic bundle 140 may include one or more fiber-optic cables and may be coupled to the fiber-optic cable mount (shown in FIG. 2).

The plasma processing chamber 100 may include a system controller 142. The system controller 142 is connected to the in-situ metrology assembly 122. The system controller 142 may include control software. When operating, the control software may instruct the in-situ metrology assembly 122 to perform measurement and receive and process measurement data from in-situ metrology assembly 122 to obtain properties of the substrate 114. The system controller 142 is also connected to the gas source 110, the RF power source 116 and other components of the plasma processing chamber 100 to perform process recipes.

Even though three fiber-optic bundles 126 are shown for measuring three measuring points 138 on the substrate 114, more or less fiber-optic bundles 126 may be used according to process requirement. In one embodiment, two plasma processing chambers 100 may be positioned side by side and sharing the light source 124 and the spectrograph 128, and six fiber-optic bundles 126 are utilized. In another embodiment, the plasma processing chamber 100 may include two sides, or processing regions, and three fiber-optic bundles 126 are used in each processing region.

Figure 2:
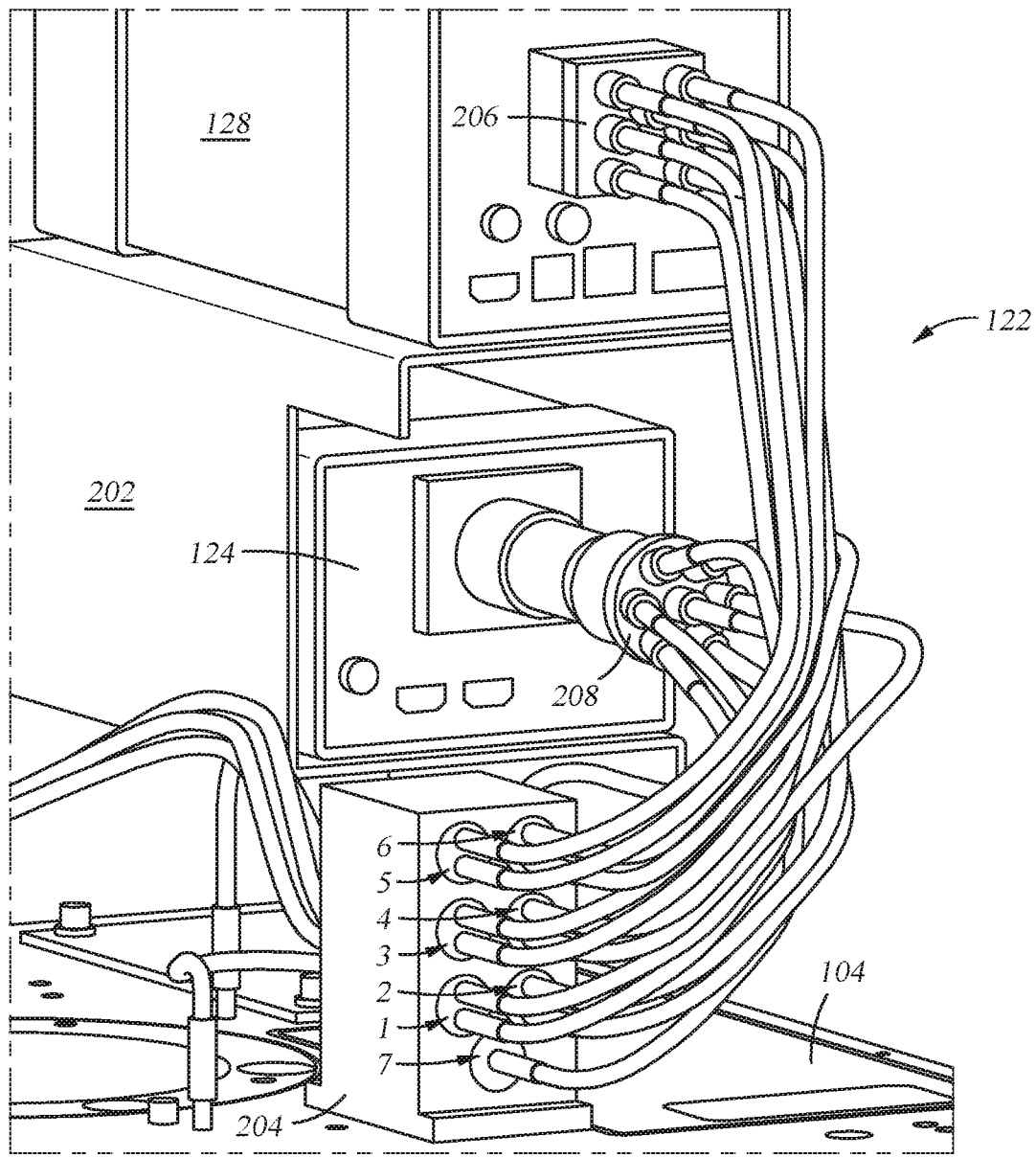
FIG. 2 illustrates an in-situ metrology assembly according to embodiments described herein.

FIG. 2 illustrates the in-situ metrology assembly 122 according to embodiments described herein. As shown in FIG. 2, the light source 124 and the spectrograph 128 are secure to the lid assembly 104 by the mounting bracket 202 in order to improve mechanical stability of the spectrograph 128 and the light source 124, which in turn improves signal stability. A fiber SMA retainer 206 may be coupled to the spectrograph 128 for tightly retaining the fiber-optic bundles 126 in order to improve signal stability. Without the fiber SMA retainer 206, the fiber-optic bundles 126 are vulnerable to be loosened due to tool vibration, manual touch and other interferences. Similarly, a fiber SMA retainer 208 may be coupled to the light source 124. Fiber SMA retainers 206, 208 on the spectrograph 128 and the light source 124, respectively, help improve signal stability. A fiber-optic cable mount 204 may be disposed on the lid assembly 104 for securing the fiber-optic bundles 126 and the reference fiber-optic bundle 140. As shown in FIG. 2, there are six fiber-optic bundles 126 (labeled 1-6) and one reference fiber-optic bundle 140 (labeled 7) coupled to the light source 124, and six fiber-optic bundles 126 (labeled 1-6) and one reference fiber-optic bundle 140 (labeled 7) coupled to the spectrograph 128.

Figure 3:
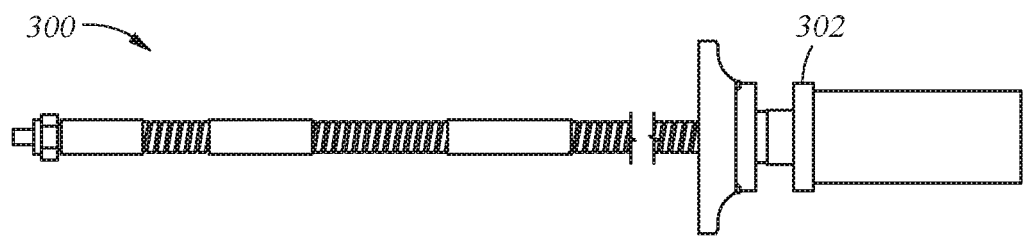
FIG. 3 is a side view of an attenuator according to embodiments described herein.

FIG. 3 is a plan view of an attenuator 300 according to embodiments described herein. The attenuator 300 may be disposed in the fiber-optic cable mount 204 and may be coupled to the reference fiber-optic bundle 140. The attenuator 300 may be fiber keyed to avoid issue caused by concentricity shift. The attenuator 300 may include a knob 302 for adjusting air-gap.

Figure 4:
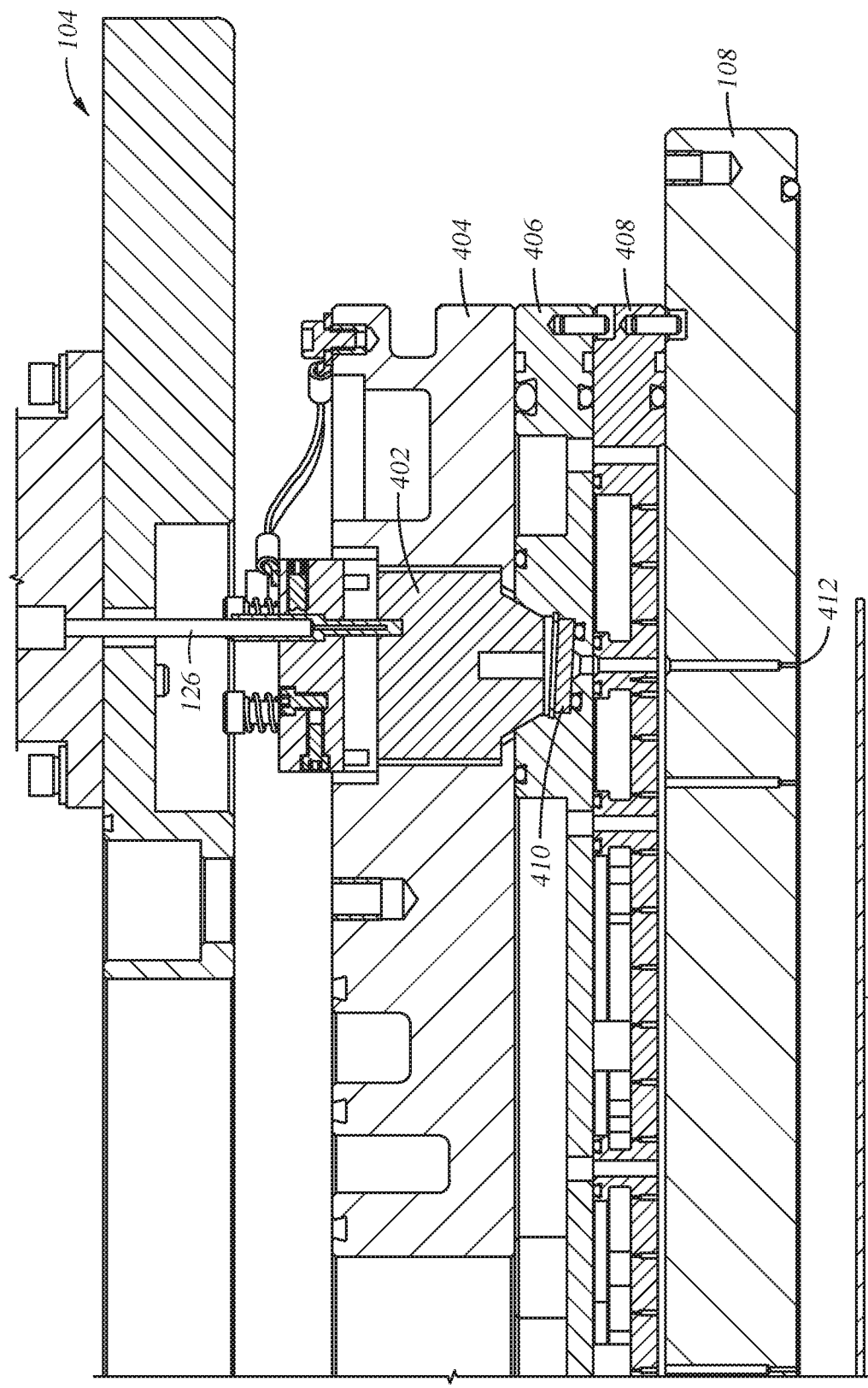
FIG. 4 is an enlarged view of a portion of the plasma processing chamber according to embodiments described herein.

FIG. 4 is an enlarged view of a portion of the plasma processing chamber 100 according to embodiments described herein. As shown in FIG. 4, a collimator 402, a gas box 404, a first blocker plate 406, and a second blocker plate 408 are disposed between the lid assembly 104 and the shower head 108. The fiber-optic bundle 126 may be coupled to the collimator 402. A sapphire window 410 may be disposed in the first blocker plate 406 and may be aligned with the collimator 402 for a light to pass through. The sapphire window 410 may be UV grade as described above. In some embodiments, instead of having the observing window 130 formed in the shower head 108, the light generated from the light source 124 passes through an opening 412 formed in the shower head 108 to reach the substrate 114, as shown in FIG. 4.

Figure 5:
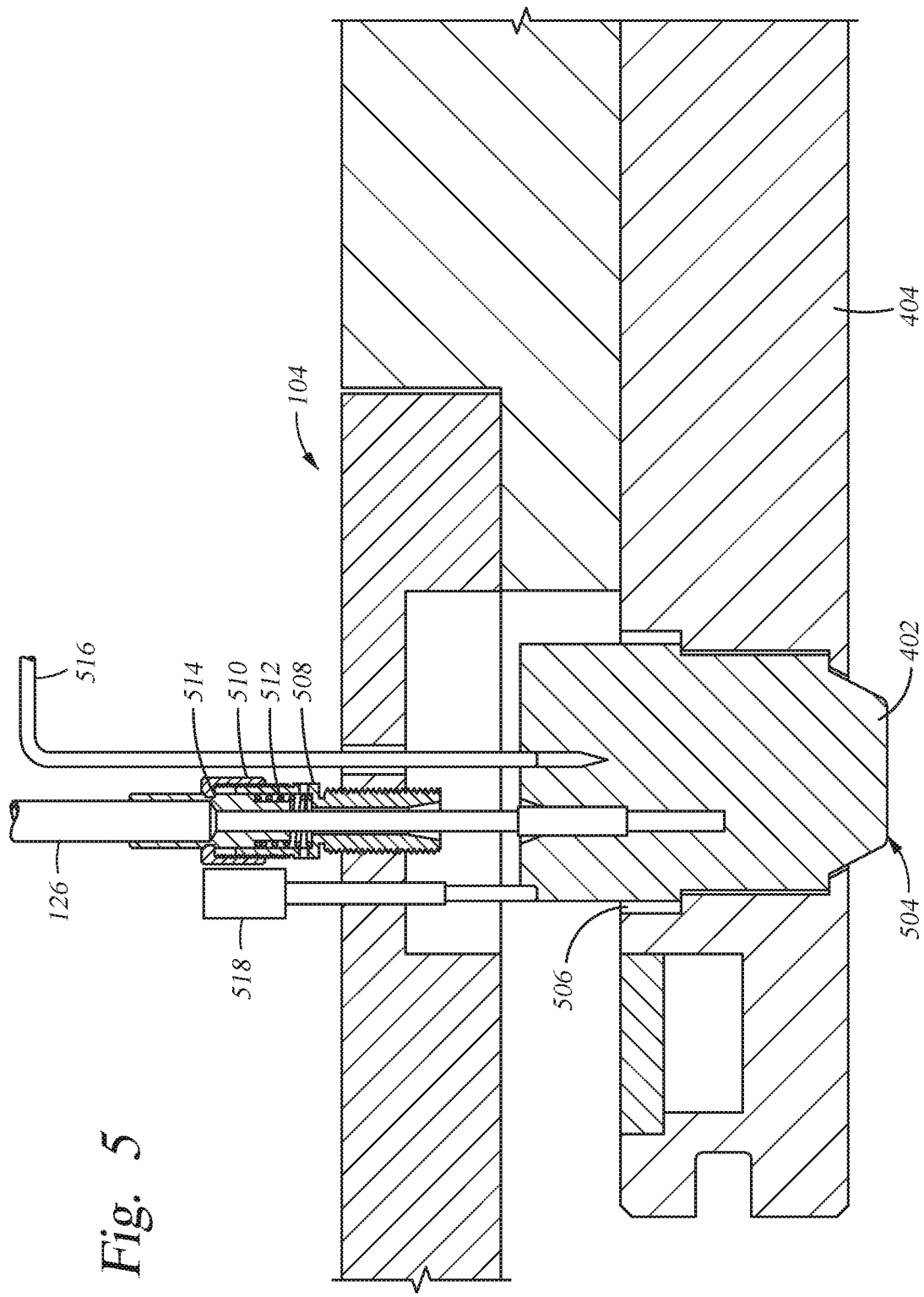
FIG. 5 is a cross sectional side view of an enlarged view of a portion of the plasma processing chamber according to embodiments described herein.

FIG. 5 is a cross sectional side view of an enlarged view of a portion of the plasma processing chamber 100 according to embodiments described herein. As shown in FIG. 5, the collimator 402 may extend through an opening 506 formed in the gas box 404. The opening 506 may be slightly wider than the width of the collimator 402 so the collimator 402 can tolerate slight misalignment when placing the collimator 402 into the gas box 404. In addition, a bottom side of the collimator 402 that is placed inside of a recess formed in the first blocker plate 406 (shown in FIG. 4) has a chamfer 504. The chamfer 504 helps the collimator 402 to slide into the recessed in the first blocker plate 406 when there is a slight misalignment. A fiber-optic bundle 126 may extend through the lid assembly 104 via an opening formed in the lid assembly 104 and coupled to the collimator 402. A stud 508, a nut 510, and a spring 512 may be utilized to adjust the vertical position of the fiber-optic bundle 126 and for locking the fiber-optic bundle 126. The stud 508 and the nut 510 may be made of a non-metallic material that can withstand elevated temperatures, such as at or over 250 degrees Celsius. In one embodiment, the stud 508 and the nut 510 are made of polyether ether ketone (PEEK). A retaining ring 514 may be surrounding the fiber-optic bundle 126. A fiber-optic bundle locking tool 516 may be inserted into the collimator 402 via an opening in the lid assembly 104 to lock the fiber-optic bundle 126 in place inside the collimator 402 (see FIG. 10 for details). In one embodiment, the locking tool 516 is an Allen wrench. One or more mirror adjusting tools 518 may extend through the lid assembly 104 via one or more corresponding openings and couple to the collimator 402 for adjusting one or more mirrors inside the collimator 402. The tools 516, 518 extend above the lid assembly 104, so settings can be adjusted without opening the lid assembly 104.

Figure 6:
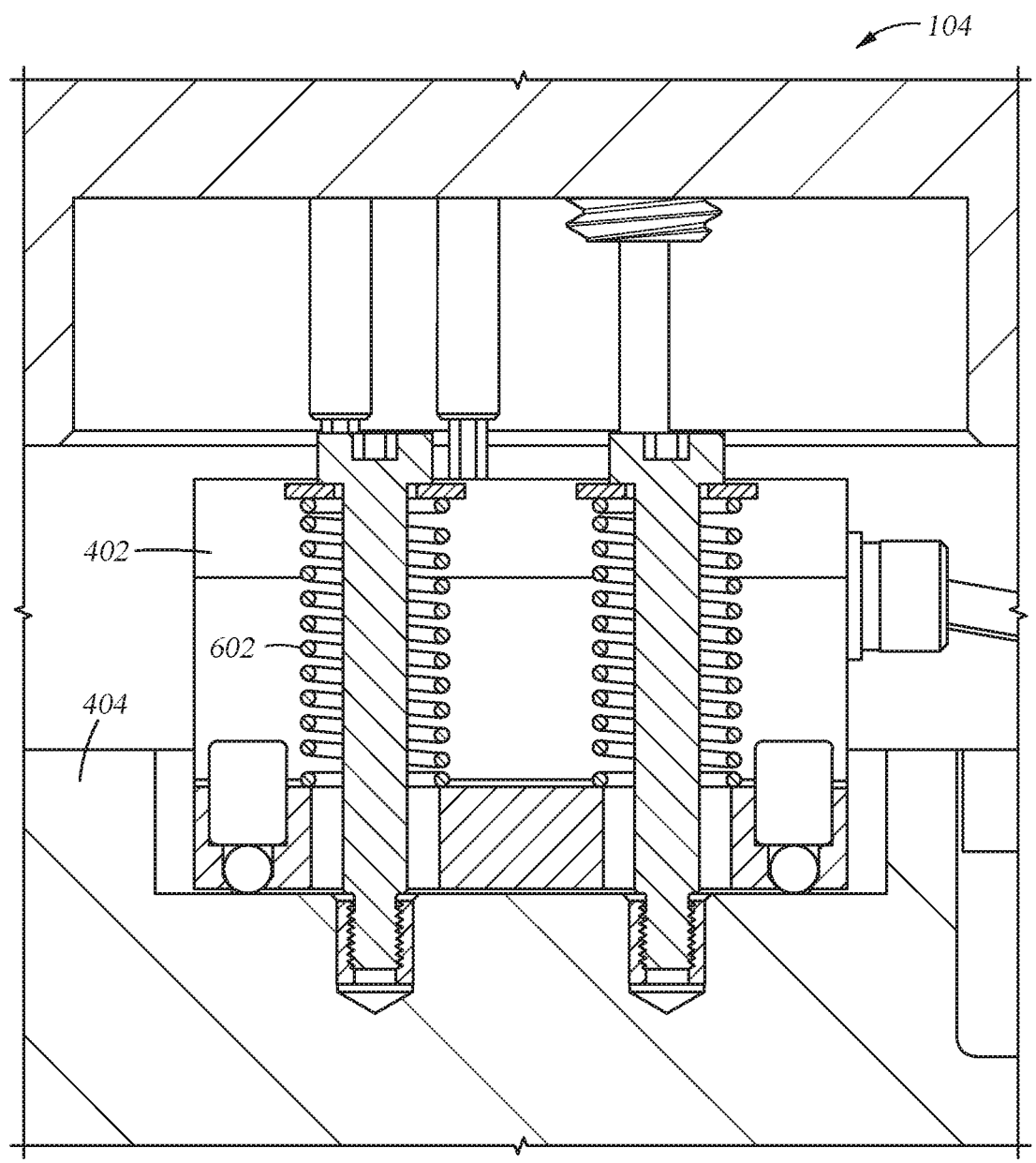
FIG. 6 is a cross sectional side view of one or more springs inside the plasma processing chamber according to embodiments described herein.

FIG. 6 is a cross sectional side view of one or more springs inside the plasma processing chamber 100 according to embodiments described herein. As shown in FIG. 6, one or more springs 602 are disposed between the lid assembly 104 and the gas box 404 for providing vertical direction rigidness.

Figure 7:
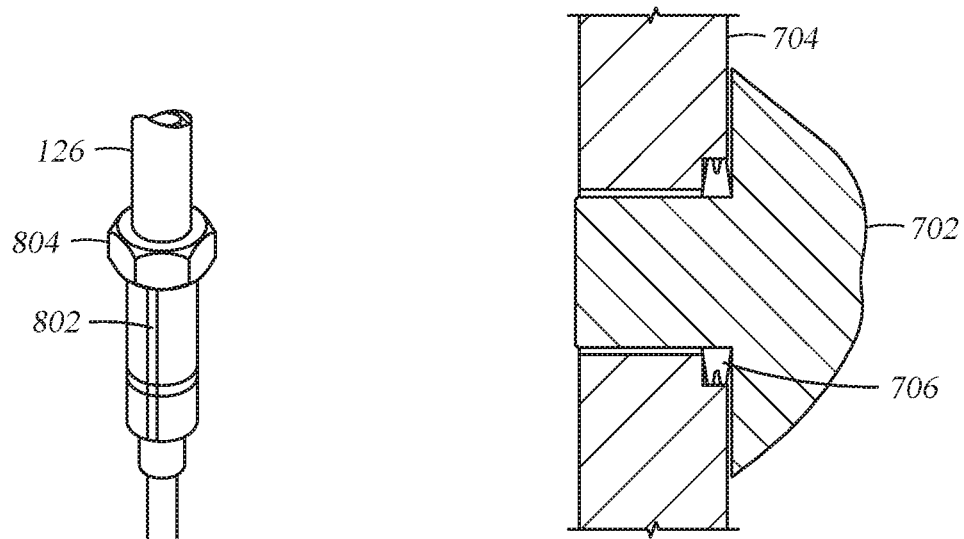
FIG. 7 is a cross sectional side view of a connecting point between a chamber lid assembly and a chamber body according to embodiments described herein.

FIG. 7 is a cross sectional side view of a connecting point between the chamber lid assembly 104 and the chamber body 102 according to embodiments described herein. As shown in FIG. 7, a chamber lid hinge 702 may be coupled to a chamber body hinge 704, and an anti-lash spring 706 may be disposed between the chamber lid hinge 702 and the chamber body hinge 704. There are two sets of the chamber lid hinge 702, chamber body hinge 704 and anti-lash spring 706 and each is disposed on one side of the processing chamber 100. The chamber lid assembly 104 may be opened by lifting one side up while the other side of the lid assembly 104 rotates about an axis formed by the two chamber lid hinges 702. The anti-lash spring 706 helps the chamber lid assembly 104 to sit in the same spatial position every time the lid assembly 104 is closed after opening by ensuring the lid assembly 104 is centered during closing of the lid assembly 104. In turn, the collimator 402 sits properly on the first blocker plate 406 within acceptable mechanical tolerance.

Figure 8:
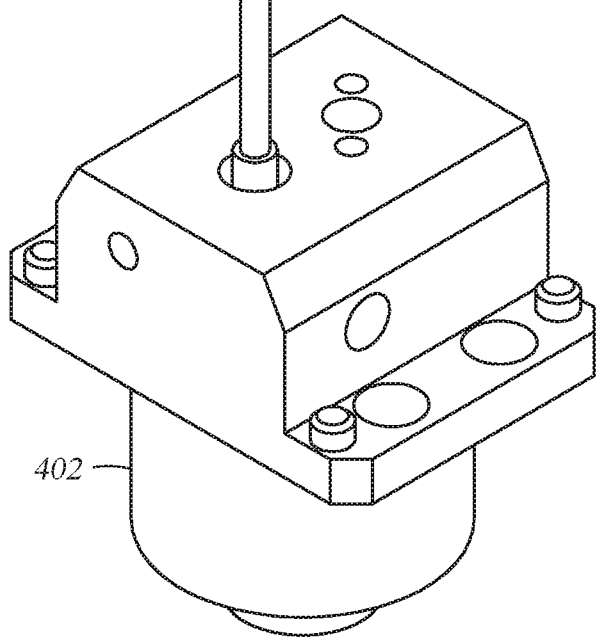
FIG. 8 illustrates a fiber-optic bundle coupled to a collimator according to embodiments described herein.
Figure 9:
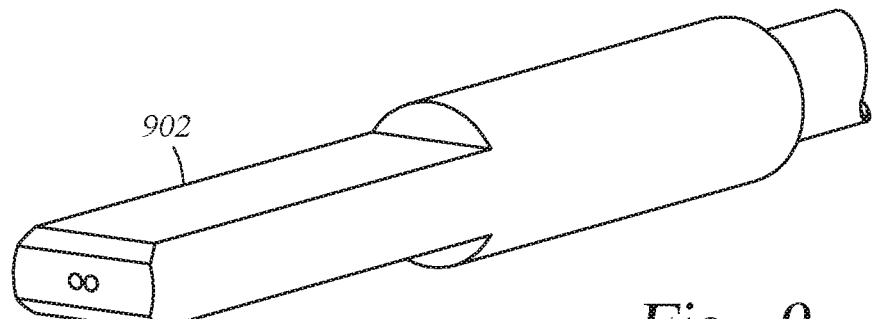
FIG. 9 illustrates a tip of the fiber-optic bundle according to embodiments described herein.

FIG. 8 illustrates the fiber-optic bundle 126 coupled to the collimator 402 according to embodiments described herein. In some embodiments, each fiber-optic bundle 126 includes two fiber-optic cables, thus rotational orientation of the fiber-optic bundle 126 becomes important for high signal intensity. In order to improve consistency in orienting the fiber-optic bundle 126, scribe line 802 and mark 804 may be formed on the fiber-optic bundle 126. In addition, as shown in FIG. 9, a tip 902 of the fiber-optic bundle 126 may be flat in order to provide consistent rotational orientation of the fiber-optic bundle 126. The tip 902 may be inserted into the collimator 402.

FIG. 10 illustrates a fiber locking system 1000 inside the collimator 402 according to embodiments described herein. The fiber locking system 1000 may include a member 1002 and a ball 1004 disposed between the member 1002 and the fiber-optic bundle 126. The member 1002 may have a portion 1006 in an upside down cone shape. After the tip 902 of the fiber-optic bundle 126 is inserted into the collimator 402, the fiber-optic bundle locking tool 516 may be used to push down portion 1006 of the member 1002. The portion 1006 in turn pushes against the ball 1004, which locks the fiber-optic bundle 126 inside the collimator 402.

The in-situ metrology assembly 122 reduces chromatic signal drift to the point that the resulting drift of measured thickness is insignificant. The thickness drift for continuous measurement using the in-situ metrology assembly 122 after deposition is almost unchanged. The in-situ metrology assembly 122 is robust and is capable of measuring thickness with high accuracy (sub-angstrom level).

Figure 11A:
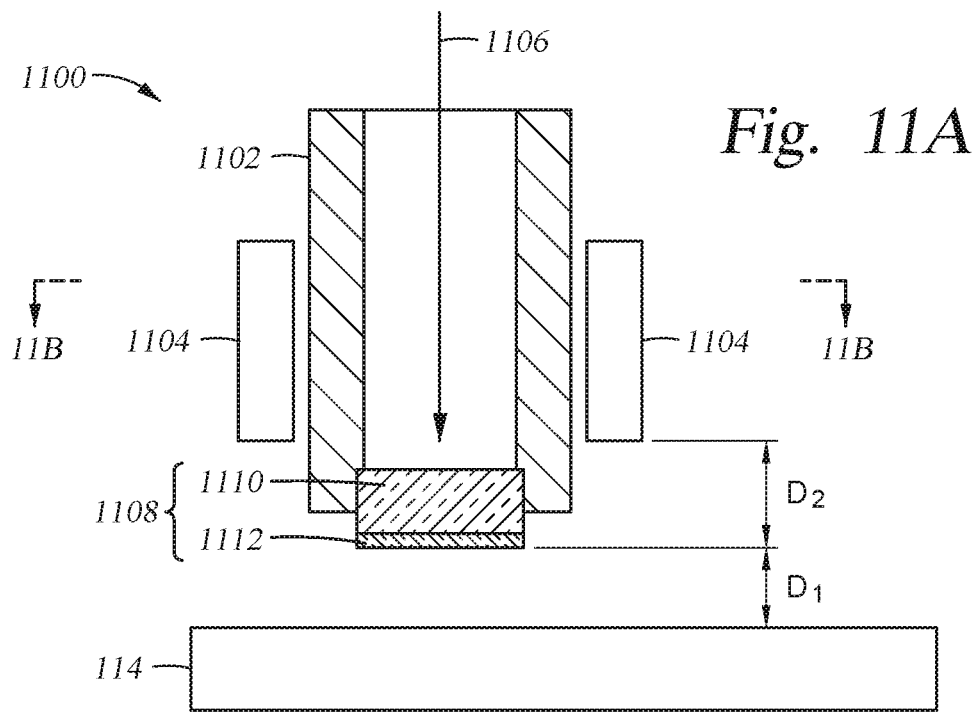
FIGS. 11A-11B schematically illustrate a substrate learning system according to embodiments described herein.
Figure 12:
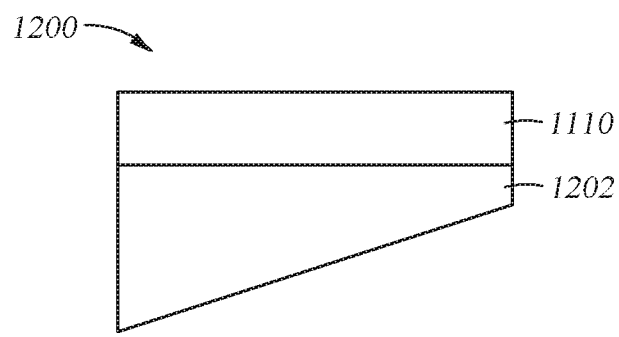
FIG. 12 is a side view of a film located in the substrate learning system according to embodiments described herein.

In some embodiments, as shown in FIG. 11A, a substrate learning system 1100 may be located inside the processing chamber 100 or inside of a different processing chamber. The substrate learning system 1100 may include a hollow cylindrical tube 1102 having a film 1108 at an end facing the substrate 114. One or more capacitance sensors 1104 may be surrounding the hollow cylindrical tube 1102. The hollow cylindrical tube 1102 may be made of an electrically non-conducting material to prevent electrical interference with the capacitance sensors 1104. The film 1108 may be a multilayer structure. In one embodiment, the film 1108 includes a first layer 1110 and a second layer 1112 facing the substrate 114. The first layer 1110 may be a transparent carrier and the second layer 1112 may be a layer having a different refractive index than the first layer 1110. In one embodiment, the refractive index of the first layer 1110 is 20% less than the refractive index of the second layer 1112. In one embodiment, the transparent carrier is made of sapphire, fused silica, glass, or quartz, and the second layer 1112 is a nitride or oxide layer. The first layer 1110 may have a thickness ranging from about 1 mm to about 3 mm, and the second layer 1112 may have a thickness ranging from about 100 nm to about 500 nm. In one embodiment, the second layer 1112 has a uniform thickness, as shown in FIG. 11A. In other embodiments, the second layer 1112 has a non-uniform thickness. As shown in FIG. 12, a wedged film 1200 may include the first layer 1110 and a second layer 1202. The second layer 1202 may be a nitride layer and may have a non-uniform thickness ranging from about 0 nm to about 500 nm.

The distance D1 between the film 1108 and the substrate 114 may range from about 100 nm to about 1000 nm, and the distance D1 may be controlled by the capacitance sensors 1104. The capacitance sensors 1104 may be offset vertically from the film 1108. In other words, the capacitance sensors 1104 may be a distance D2 from a surface of the film 1108 that is facing the substrate 114, and the capacitance sensors 1104 are farther from the substrate 114 than the film 1108. With the distance D2, the sensors 1104 have better linearity and accuracy. In some embodiments, other sensors such as inductive proximity sensors, laser displacement sensors, or an image focusing system with video camera may be used instead of capacitance sensors to measure and control the distance D1. In addition, reflected signal from the substrate 114 as a light 1106 passes through the film 1108 can be monitored as an indicator of the distance D1. This signal may be used as an additional safeguard to prevent contact between the film 1108 and the substrate 114. A piezo-electric motor/stage (not shown) may be utilized to provide vertical motion of the substrate learning system 1100, and a mechanical stage (not shown) may be utilized to provide horizontal motion of the substrate learning system 1100 and for positioning the substrate learning system 1100 to any location above the substrate 114.

Figure 11B:
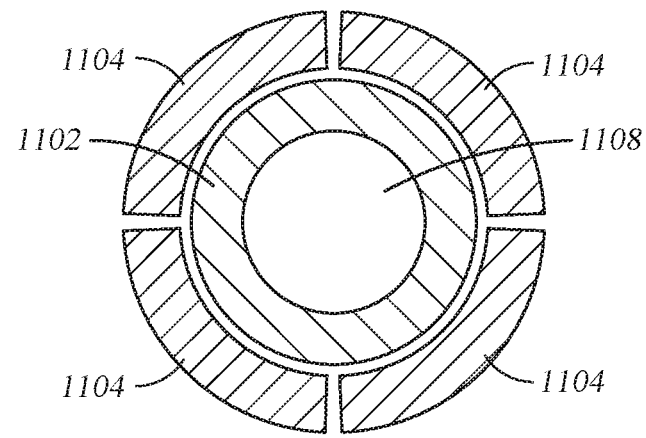

FIG. 11B is a cross sectional view of the substrate learning system 1100 at cross section 11B shown in FIG. 11A. As shown in FIG. 11B, there are four capacitance sensors 1104 surrounding the hollow cylindrical tube 1102. With four capacitance sensors 1104, there are four independent measurements of the distance D1, in order to ensure that the film 1108 is as parallel as possible with respect to the surface of the substrate 114. Having the film 1108 as parallel as possible to the surface of the substrate 114 prevents tilting of the film 1108, which can cause one or more corners of the film 1108 to be in contact with the surface of the substrate 114. The width of each capacitance sensor 1104 may range from about 2 mm to about 5 mm.

Prior to processing the substrate 114, the substrate learning system 1100 may be used to impart known and varying phase information to the light reflected from the surface of the substrate 114. This can be accomplished by inserting the second layer 1112 or 1202 into the light 1106 (shown in FIG. 11) between the light source 124 (shown in FIG. 1) and the substrate 114. Due to the limited coherence length of the light, the thickness of the second layer 1112 or 1202 and the distance D1 may be below the coherence length, which is typically less than about 3 microns for a typical broadband light source, such as the light source 124. A practical approach of inserting such thin layer into the beam path is to use the first layer 1110 as a carrier. The first layer 1110 and the second layer 1112 or 1202 have known thicknesses and refractive indices. In one embodiment, the film 1108 is utilized. Phase variation information is based on the distance D1, and the distance D1 may be varied by moving the film 1108 away from the substrate 114 from a predetermined starting point. The distance D1 may vary from about 100 nm to about 1000 nm. Phase variation information may be obtained by moving the film 1108 away from the substrate 114, i.e., by increasing the distance D1. The substrate 114 may be rotated and phase variation information at a different location on the substrate may be obtained. The steps may be repeated until locations on the substrate on which the greatest phase variation is shown are identified. These locations may be used as the measurement points. In one embodiment, the film 1200 is utilized. Phase variation information is based on the film thickness variation as the film 1200 slides horizontally (transversely) across the light 1106. Phase variation information may be obtained by moving the film 1200 laterally across light 1106 to produce an apparent change in the thickness of the film over the substrate. Similarly, measurement points may be identified by using the method described above.

Figure 13:
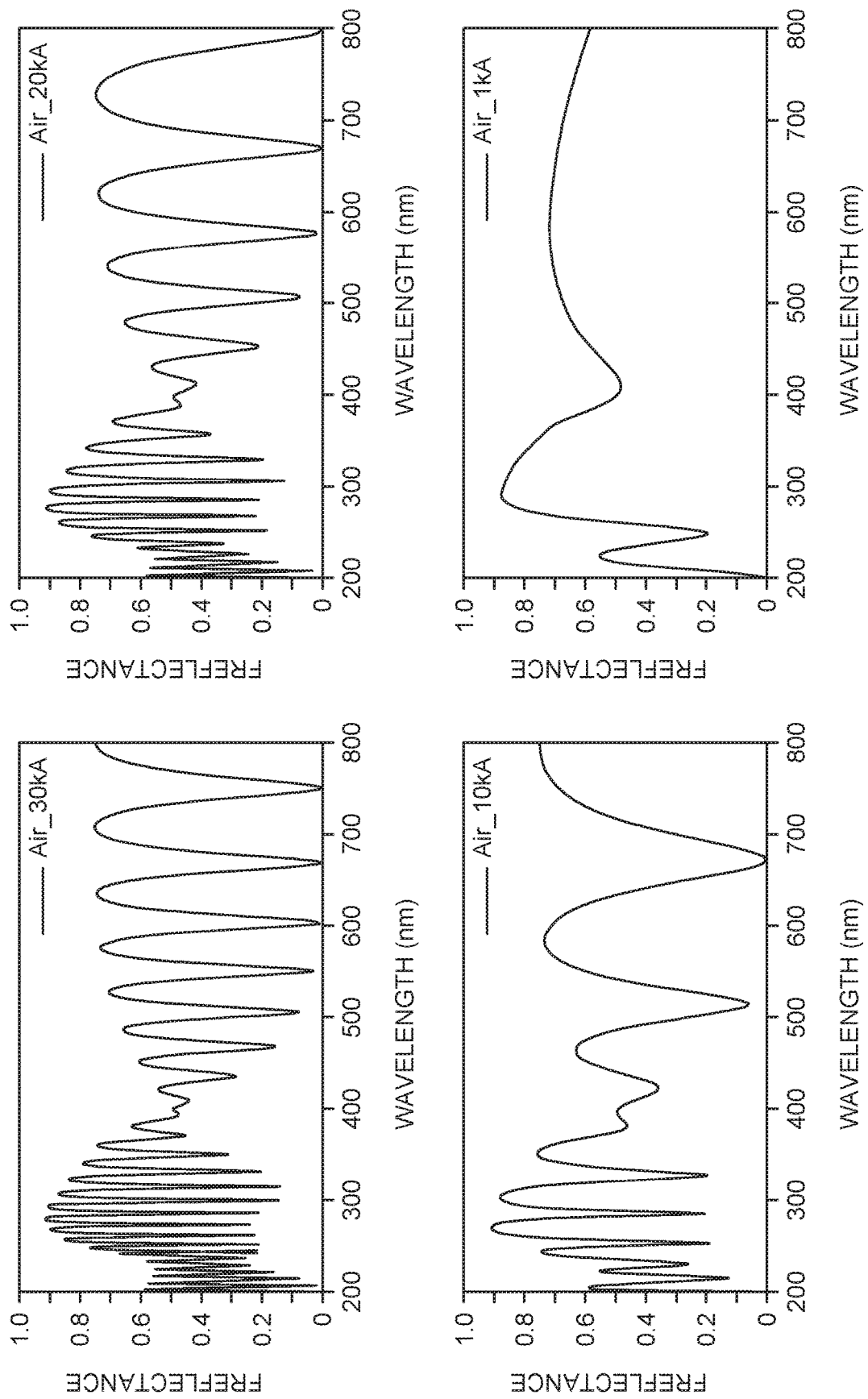
FIG. 13 shows charts of reflectance spectra generated by utilizing a substrate learning system according to embodiments described herein.

FIG. 13 shows charts of reflectance spectra generated by utilizing the substrate learning system 1100 according to embodiments described herein. The spectra show that the fringe density reduces as the distance D1 is lowered from about 30,000 Angstroms to about 1,000 Angstroms. The film model can then be used to fit the spectra to solve for the distance D1 as long as the distance D1 is within the coherence length of the light 1106.

Processing

Embodiments of the present disclosure include methods for in-situ measurement of properties, such as thickness, of multiple films formed on a random base layer on a substrate. The methods may be performed using the plasma processing chamber 100 and the in-situ metrology assembly 122 described above. The methods may be used in measuring and controlling film thickness during formation of flash memory film stacks.

Determining Substrate Orientation

Prior to depositing multiple layers on a substrate, the substrate orientation may be determined. The optimal substrate orientation may be determined by identifying the optimal combination of measurement points on the substrate. The measurement points may be the measurement points 138 shown in FIG. 1. In one embodiment, there are three measurement points on the substrate. There may be a plurality of possible measurement points on the substrate, and the optimal combination of three measurement points may be identified by a non-destructive method. The non-destructive method means that the surface of the substrate is not modified. The non-destructive method may include direct a light to the surface of the substrate and searching for optimal substrate amplitudes at measurement points by rotating the substrate and looking for the combination of measurement points having the highest reflectivity (e.g., pattern structure is not scattering or cancelling reflected light) and consistent reflectivity over the substrate placement tolerance (i.e., amplitude component of complex reflectivity is insensitive to variability in substrate placement). This method may be performed in a processing chamber, such as the processing chamber 100, using an in-situ metrology system, such as the in-situ metrology assembly 122. Alternatively, the method may be performed outside of the processing chamber, such as at a pre-aligner station, which eliminates loading and unloading of the substrate for every adjustment to the substrate orientation.

In some embodiments, the optimal combination of measurement points may be identified by depositing an oxide layer on the substrate and searching for optimal substrate phases at various orientations. The oxide layer may be deposited on the substrate at every orientation, and the signal change is dynamically monitored to find optimal measurement points with the greatest curvature in the sinusoidal reflectivity response across the wavelength region of interest, consistent reflectivity response over the substrate placement tolerance (i.e., complex reflectivity is insensitive to variability in substrate placement), and the greatest peak amplitude (e.g., pattern structure is not scattering or cancelling reflected light). This method may be performed in a processing chamber, such as the processing chamber 100, using an in-situ metrology system, such as the in-situ metrology assembly 122. The substrate inside the processing chamber may be rotated to various orientations.

In some embodiments, a library of starting substrate signatures can be created by learning the complex reflectivity of the substrate at more than one orientation/measurement location. When substrate orientation/placement causes the measurement spot to land on different pattern structures with distinct complex reflectivity, the library of signatures can be searched or interpolated to find the closest match to the complex reflectivity values at the current measurement location. The starting substrate signatures can be obtained by growing a thick film, such as an oxide film having a thickness of 1000 Angstroms or more, on a single substrate multiple times at multiple orientations. For example, the phase information during the growth of a first oxide film having a thickness of about 1000 Angstroms on the substrate is recorded and analyzed. The orientation of the substrate is then changed (i.e., rotating the substrate), and a second oxide film having a thickness of about 1000 Angstroms is grown on the substrate. The phase information during the growth of the second oxide film is again recorded and analyzed. Additional thick oxide films may be grown on the substrate at different orientations, and the phase information during the growth of the additional oxide films is recorded and analyzed. The optical properties of the thick oxide films is recorded at each substrate orientation and excluded from subsequent calculation of the complex reflectivity of the substrate. In one embodiment, the complex reflectivity of the substrate is calculated using dynamic time-series calculation, and the optical properties at different substrate orientations are averaged to cancel out or to significantly reduce the loading effect.

Non-Destructive Method for Determining Complex Reflectivity

In one embodiment, the complex reflectivity at the measurement points can be determined by a non-destructive method. The non-destructive method may include using an active optical element to introduce a known, controllable change in the optical path of the spectrograph. The substrate learning system 1100 may be utilized as the active optical element. The method of operating the substrate learning system 1100 may be the non-destructive method to introduce a known, controllable change in the optical path of the spectrograph. The non-destructive method may be performed in a processing chamber, such as the processing chamber 100, using the substrate learning system 1100. Alternatively, the non-destructive method may be performed in a preparation station outside of the processing chamber, such as at the pre-aligner station. At the preparation station, the properties of the substrate may be learned at the same locations where growth of film layers is measured inside the processing chamber. It is important to maintain substrate orientation as characterized during robotic transfer to the processing chamber. This ensures that the measurement points identified by the non-destructive method correspond to the actual measurement points inside the processing chamber. The benefit of this non-destructive method is that multiple cycles of phase change data can be extracted to accurately measure complex reflectivity of the substrate without depositing an oxide layer on the substrate.

Compensation for Sources of Spectrograph Signal Drift

The collimator, such as the collimator 402, may be temperature stabilized to minimize temperature-induced changes in light beam quality and position. The collimator may be heated and controlled during operation at a temperature which is about 5 degrees Celsius higher than the hottest possible ambient temperature. The components inside the collimator in which the light beam may pass may be made of a material having low coefficient of thermal expansion, such as Invar (64FeNi), in order to create temperature invariant beam path which does not move significantly over the typical range of collimator operating temperatures. In some embodiments, the collimator may include components that may be adjusted in order to compensate for temperature induced movement of other components. In some embodiments, temperature induced movements of one optical component (as detected by sensor) is corrected with an actively controlled compensating movement. In some embodiments, temperature-compensating signal analysis may be performed. One example of temperature-compensating signal analysis may include thermocouple feedback to correct known/calibrated sources of signal distortion due to thermal drift. Prior characterization of the processing chamber's behavior versus temperature may be performed.

In some embodiments, a flat-topped light beam with over-filled apertures may be utilized to reduce signal drift. The light beam may have a beam profile that is wider than the diameter of the aperture. Thus, flat-topped light can move laterally without affecting light delivered past the aperture (through opening or the observing window formed in the shower head) to the substrate or reflected back past the aperture to the spectrograph. The opening may be the opening 412 shown in FIG. 4, the observing window may be the observing window 130 shown in FIG. 1, and the shower head may be the shower head 108 shown in FIG. 1. Similarly, a light beam having a beam profile that is smaller than the diameter of the aperture may also have the same effect. In some embodiments, the observing windows formed in the shower head may have a diameter that is substantially larger so the window is insensitive to worst-case movement of the shower head relative to the light beam. The diameter of the observing window may be larger than the sum of the light beam diameter and the largest thermally induced movement of the window relative to the light beam. Additionally, the observing window may be sealed and have a thermal footprint similar to the rest of the shower head to avoid any thermal effects on the substrate which is located under the shower head.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber, comprising:
 a substrate support disposed in the processing chamber; and
 a substrate learning system disposed in the processing chamber opposite the substrate support, the substrate learning system comprising:
  a hollow cylindrical tube; and
  a film located at one end of the hollow cylindrical tube proximate the substrate support and spaced therefrom, wherein the film is a multilayer structure including a first layer and a second layer, wherein the second layer has a different refractive index than the first layer.

2. The processing chamber of claim 1, wherein the first layer comprises sapphire, fused silica, glass, or quartz and the second layer comprises a nitride or oxide layer.

3. The processing chamber of claim 1, wherein the first layer has a thickness ranging from about 1 mm to about 3 mm and the second layer has a thickness ranging from about 100 nm to about 500 nm.

4. The processing chamber of claim 1, wherein the second layer has a uniform thickness.

5. The processing chamber of claim 1, wherein the second layer has a non-uniform thickness.

6. The processing chamber of claim 1, wherein the processing chamber further comprises:
 a chamber body;
 a lid assembly disposed over the chamber body, wherein the lid assembly includes a shower head; and
 an in-situ metrology assembly, wherein the in-situ metrology assembly comprises:
  a light source;
  a spectrograph; and
  one or more fiber-optic bundles.

7. The processing chamber of claim 6, further comprising a mounting bracket for securing the light source and the spectrograph to the lid assembly.

8. The processing chamber of claim 6, wherein the shower head includes one or more observing windows.

9. The processing chamber of claim 8, wherein the observing window is made of sapphire, $MgF_2$ or $CaF_2$.

10. The processing chamber of claim 6, wherein the one or more fiber-optic bundles each includes one or more fiber-optic cables, and each fiber-optic cable has a diameter of about 200 microns.

11. A processing chamber, comprising:
 a chamber body;
 a substrate support disposed in the chamber body;
 an in-situ metrology assembly, wherein the in-situ metrology assembly comprises:
  a light source;
  a spectrograph; and
  one or more fiber-optic bundles; and
 a substrate learning system disposed in the chamber body opposite the substrate support, the substrate learning system comprising:
  a hollow cylindrical tube; and
  a film located at one end of the hollow cylindrical tube proximate the substrate support and spaced therefrom, wherein the film is a multilayer structure including a first layer and a second layer, wherein the second layer has a different refractive index than the first layer.

12. The processing chamber of claim 11, wherein the first layer comprises sapphire, fused silica, glass, or quartz and the second layer comprises a nitride or oxide layer.

13. The processing chamber of claim 11, wherein the first layer has a thickness ranging from about 1 mm to about 3 mm and the second layer has a thickness ranging from about 100 nm to about 500 nm.

14. The processing chamber of claim 11, wherein the second layer has a uniform thickness.

15. The processing chamber of claim 11, wherein the second layer has a non-uniform thickness.

16. A chamber, comprising:
 a substrate support disposed in the chamber; and
 a substrate learning system disposed in the chamber opposite the substrate support, the substrate learning system comprising:
  a hollow cylindrical tube;
  a film located at one end of the hollow cylindrical tube proximate the substrate support and spaced therefrom, wherein the film is a multilayer structure including a first layer and a second layer, wherein the second layer has a different refractive index than the first layer; and
  one or more capacitance sensors surrounding the hollow cylindrical tube.

17. The chamber of claim 16, wherein the first layer comprises sapphire, fused silica, glass, or quartz and the second layer comprises a nitride or oxide layer.

18. The chamber of claim 16, wherein the first layer has a thickness ranging from about 1 mm to about 3 mm and the second layer has a thickness ranging from about 100 nm to about 500 nm.

19. The chamber of claim 16, wherein the second layer has a uniform thickness.

20. The chamber of claim 16, wherein one or more capacitance sensors are four capacitance sensors.

* * * * *